United States Patent [19]

Duguay

[11] 3,958,229
[45] May 18, 1976

[54] OPTICAL MEMORY SYSTEMS UTILIZING ORGAN ARRAYS OF OPTICAL FIBERS

[75] Inventor: Michel Albert Duguay, Summit, N.J.

[73] Assignee: Bell Telephone Laboratories, Incorporated, Murray Hill, N.J.

[22] Filed: Mar. 10, 1975

[21] Appl. No.: 556,637

Related U.S. Application Data

[62] Division of Ser. No. 401,635, Sept. 28, 1973, Pat. No. 3,892,468.

[52] U.S. Cl. .................... 340/173 LM; 340/173 R; 340/173 LT; 350/96 B
[51] Int. Cl.² .................. G11C 11/42; G11C 13/04
[58] Field of Search... 340/173 R, 173 LT, 173 LM; 350/96 B

[56] References Cited
UNITED STATES PATENTS
3,902,788  9/1975  Strehlow ........................ 340/173.2

Primary Examiner—Terrell W. Fears
Attorney, Agent, or Firm—M. J. Urbano

[57] ABSTRACT

An organ array comprises a plurality of optical fibers each cut to a different length with the differences between functionally adjacent (i.e., lengthwise consecutive) fibers being uniform. The fibers are arranged in a bundle so that one set of ends of the fibers is terminated in an input plane and the opposite set of ends is terminated in an output plane. Described are several embodiments utilizing the organ array including a passive spatial scanner, optical memory systems, an image converter, an optical sampling oscilloscope, and an x-y coordinate locater.

3 Claims, 10 Drawings

PASSIVE LINE SCANNER

PASSIVE RASTER SCANNER

MEMORY SYSTEMS

OPTICAL MEMORY SYSTEMS UTILIZING ORGAN ARRAYS OF OPTICAL FIBERS

CROSS REFERENCE TO RELATED APPLICATIONS

This application is a division of parent application Ser. No. 401,635 filed on Sept. 28, 1973 (now U.S. Pat. No. 3,892,468) and was concurrently filed with two other divisional applications of the same parent: Divisional applications Ser. No. 556,636 (now U.S. Pat. No. 3,925,727 entitled "Optical Sampling Oscilloscope Utilizing Organ Arrays of Optical Fibers" and Ser. No. 556,638 entitled "Optical Detection System Utilizing Organ Arrays of Optical Fibers." The parent application was concurrently filed with two related applications: Ser. No. 401,633 (now U.S. Pat. No. 3,838,278) entitled "Two Optical Switching Networks Utilizing Organ Arrays of Optical Fibers" and Ser. No. 401,632 (now U.S. Pat. No. 3,849,604) entitled "Time Slot Interchanger for Time Division Multiplex System Utilizing Organ Arrays of Optical Fibers."

BACKGROUND OF THE INVENTION

This invention relates to arrays of optical fibers, and, more particularly, to passive spatial scanners, optical memories, image converters and other optical apparatus utilizing same.

Optical memories proposed by many workers in the laser art typically include an optical scanner to perform the necessary read and write functions. Most commonly the scanner utilizes an active device, such as an electro-optic or acousto-optic modulator, to deflect a laser beam in raster fashion. In this type of active scanner, however, important parameters such as bandwidth, the number of resolvable spots, and drive power involve numerous trade-offs which, in conjunction with inherent materials restrictions, limit their usefulness in optical memories as well as in numerous other applications including real-time display devices, hard copy reproduction devices, carrier modulators and the like. Described hereinafter, however, is a passive scanner in accordance with my invention which reduces significantly many of the foregoing problems encountered with active scanners.

Similar trade-offs arise in the design of image converters, especially where the image to be detected is virtually instantaneous. An example of the latter is a picosecond light pulse. In recent years many techniques have been developed to display and measure such light pulses; e.g., two-photon fluorescence, picosecond streak cameras, light-in-flight photographic techniques and echelon techniques, all of whch typically display the pulse on photographic film. Unfortunately, the nonlinearity and limited dynamic range of fast photographic film entail time-consuming photodensitometry and limit the practical usefulness of these methods. Although picosecond pulses can also be measured utilizing second harmonic generation, many laser shots are required so that it may take several hours to obtain one pulse display. The problem is further compounded by the irreproducibility of present high-power picosecond-pulse lasers. Described hereinafter, however, is an optical sampling oscilloscope in accordance with my invention which gives instantly a linear display of a single picosecond pulse on a nanosecond real-time oscilloscope.

SUMMARY OF THE INVENTION

As used hereinafter, an "organ" array of optical fibers comprises a bundle of optical fibers each having a different length with the difference in length between functionally adjacent fibers being uniform. The term "functionally" adjacent means lengthwise consecutive and includes, for example, in a raster of fibers not only fibers physically adjacent one another in the same row, but also fibers physically remote such as the last fiber of one row and the first fiber of the next row. The organ array is further characterized in that one set of fiber ends is terminated in an input plane and the opposite set of ends is terminated in an output plane. The two planes need not be parallel, nor even "planar" in the geometric sense since either set of ends can terminate on a curved surface or even in an incoherent array of points.

In an illustrative embodiment of my invention, a passive optical scanner comprises a pulsed light source, such as an LED or laser, means for producing a plurality of spatially separated light pulses from each light pulse generated by the pulsed source, and means for coupling each of the spatially separated pulses into separate ones of the fibers of the organ array at its input plane. Because the differential fiber length produces a proportional differential time delay, a plurality of pulses, substantially identical in transverse shape to the source pulses, appear at the output plane at different times and in different spatial locations.

My passive optical scanner involves no deflection of a laser beam but instead employs a unique combination of elements including an "organ" array of optical fibers to produce linear or raster scanning of light pulses. The number of resolvable spots in determined primarily by the diameter of the fibers and the coupling optics, the scanning rate is determined primarily by the differential length of the fibers, and the spatial scanning range is determined primarily by the spatial pattern of the output ends of the organ fiber array. Also the scanning is done in discrete steps; i.e., if a row of discrete spots on a target is to be scanned, light appears sequentially only at those spots, and none appears at intermediate positions.

The essence of this embodiment of my invention, therefore, lies in the recognition that a pulsed optical source in conjunction with a suitable passive device produces scanning, a *dynamic* function.

My optical scanner can be utilized to perform a scanning function in a memory system in which, for example, a translating memory tape or rotating disc is juxtaposed with the output plane of an organ array to read out information on the tape or disc, or in conjunction with a suitable modulator, to write information onto the tape or disc.

When combined with other components, my scanner can also be utilized to perform a variety of display functions. Thus, for example, when the tandem combination of a second organ array and an optical gate is interposed between the pulsed light source and the first array, the arrangement functions as an optical sampling oscilloscope capable of displaying sub-nanosecond optical pulses with picosecond resolution on an electronic oscilloscope having only nanosecond risetime.

In addition, a two-dimensional organ fiber array can be utilized as an *x-y* coordinate locater by positioning the input planes of two interleaved organ arrays, each having a mutually exclusive set of delays, under a writing surface. One array of fibers corresponds to the x coordinates and another set of fibers corresponds to the y coordinates. A pulsed light pen (e.g., a pulsed laser) directs a spot of light of sufficient size on the writing surface to overlap at least two fiber ends of adjacent fibers in different arrays. The outputs of both arrays are coupled to a photodiode which produces electrical pulses whose times of occurrence are a function of the position of the light spot in the x-y plane. These times of occurrence relative to the firing time of the light pen can be coded in the form of digital electronic pulses. Consequently, information which is written by the light pen is converted to a digital form suitable for transmission to a remote location.

The foregoing locater is a special case of an image converter also described.

BRIEF DESCRIPTION OF THE DRAWING

My invention, together with its various features and advantages, can be easily understood from the following more detailed description taken in conjunction with the accompanying drawing, in which.

DETAILED DESCRIPTION

Passive Scanner

Figure 1:
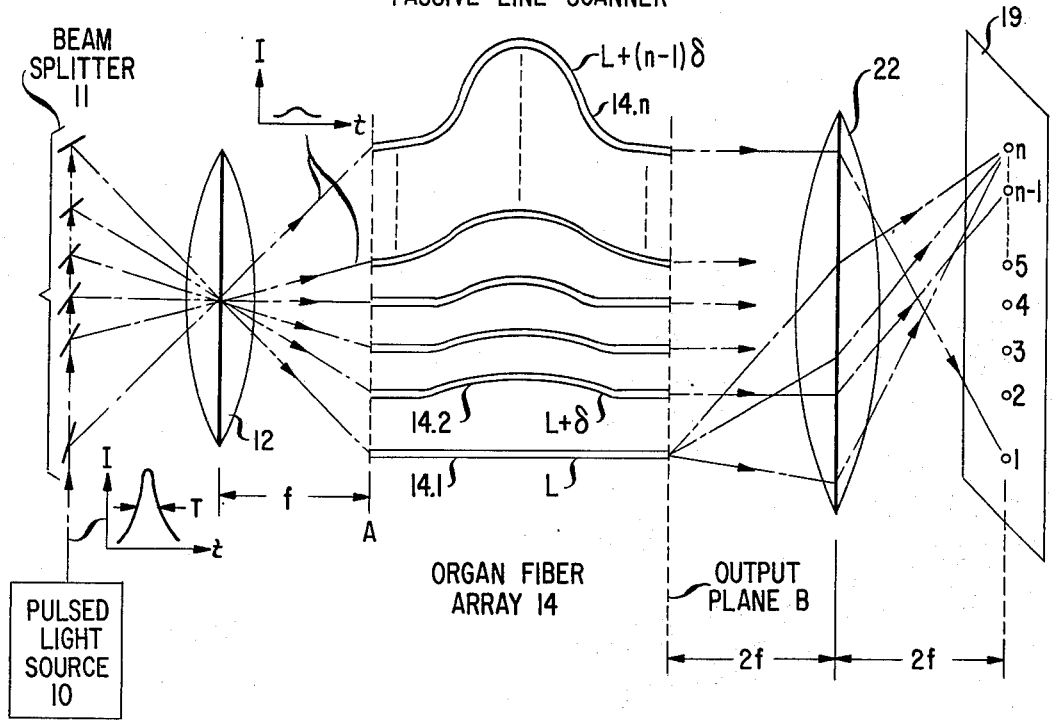
FIG. 1 schematically shows a passive optical line scanner in accordance with an illustrative embodiment of my invention.

Turning now to FIG. 1, there is shown a passive line scaner illustrating comprising a pulsed light source 10, such as a laser or an LED, the collimated output of which is directed through a plurality of tandem beam splitters 11 which produce a corresponding plurality of light pulses from each source pulse generated by source 10. The plurality of light pulses propagate along separate noncollinear paths to a lens means 12 which focuses the pulses onto the input plane A of an organ fiber array 14, the input plane A being positioned at the focal point of lens means 12.

The organ fiber array 14 comprises a bundle (of plurality $n$) of optical fibers each having different lengths, with the difference $\delta$ in length between lengthwise consecutive (i.e., functionally adjacent) fibers being uniform. Thus, fiber 14.1 is depicted as having length L, adjacent fiber 14.2 has a length $(L + \delta)$ whereas fiber 14.n has a length $(L + (n-1)\delta)$. In addition, one end of each of the optical fibers is terminated in the input plane A, whereas the opposite ends are terminated in an output plane B, but the planes A and B need not be parallel.

Because the uniform difference $\delta$ in length of the fibers of array 14 produces a proportional uniform difference $\Delta\tau$ in time delay, each of the plurality of light pulses arrives at the output plane B at different times (corresponding to the difference $\Delta\tau$) and in a different spatial location (corresponding to the locations in space of the output ends of the fibers).

Note that, in general, one skilled in the art would typically take into account the different path lengths from the source 10 through the beam splitters 11 and lens means 12 to input plane A in making the differential delay $\Delta\tau$ uniform. Moreover, for efficient optical coupling the directions of the pulses may be made collinear with the directions of the fiber ends at input plane A. In addition, dispersion introduced by the fibers may be readily compensated by means well known in the art, e.g., by means of grating-pairs or Gires-Tournois interferometers.

Advantageously, the pulses arriving at output plane B are all substantially identical in intensity and transverse shape to one another; that is, recognizing that there are inherent optical coupling losses, each pulse has an intensity equal approximately to $n^{-1}$ times the intensity of the source pulse generated by source 10, but has the same transverse shape as the source pulse.

The net effect of this combination of elements is to produce a discretely scanning spot of light, i.e., pulses of light which arrive sequentially at output plane B at locations corresponding to the output of ends of fibers 14.1 to 14.n in that order. Consequently, the entire line of spots between the first fiber and the $n^{th}$ fiber is scanned in a time equal to $(n-1)\Delta\tau$. For example, if a 100 ps pulse from a laser is coupled into a fiber array 14 designed so that the differential length $\delta$ produces a differential time delay $\Delta\tau$ 0.5 ns, then an array of 101 fibers would scan a line in 500 ns.

Inasmuch as the output from an optical fiber typically has considerable beam divergence, it may be desirable to position a lens means 22, or other suitable focusing means, between output plane B and an object 19 to be scanned. In this regard, the lens means 22 should be positioned at a distance approximately equal to $2f$ from both plane B and object 19, where $f$ is the focal length of lens means 22.

In general, however, to achieve scanning, it is desirable that the pulses arrive at output plane B with as little time-wise overlap as possible; i.e., two or more pulses should not reach output plane B so close in time to one another that both appear substantially simultaneously. To this end, the differential time delay $\Delta\tau$ of array 14 should be greater than the duration T of the source pulses as measured at half-maximum intensity.

Advantageous aspects of my passive line scanner include the following: (1) the output pulses arriving at plane B have substantially identical transverse shapes and substantially identical power density distributions thereby insuring that the effect of each output pulse on a detector or other utilization means is substantially the same. Consequently, additional components or circuitry are not required to compensate for unwanted variations in power from one pulse to another; (2) the scanning function is performed without the necessity of deflecting the light beam; i.e., without using an active modulator. Instead scanning is performed passively by the unique combination of the beam splitters 11, the lens means 12, and the organ fiber array 14; (3) in this regard the number of spots or information points resolvable by my passive scanner is determined primarily by the diameter of the fibers used; the scanning rate is determined primarily by the practical limitations on producing small differential lengths and by the bandwidth limitation of utilization means; and the scanning range (corresponding to the angular deflection in an active scanner) is determined primarily by the spread of the output ends of the fibers in the output plane B; and (4) the scanning is done in spatially discrete steps, a highly desirable feature in digital memories and for writing on color TV screens.

Figure 2:
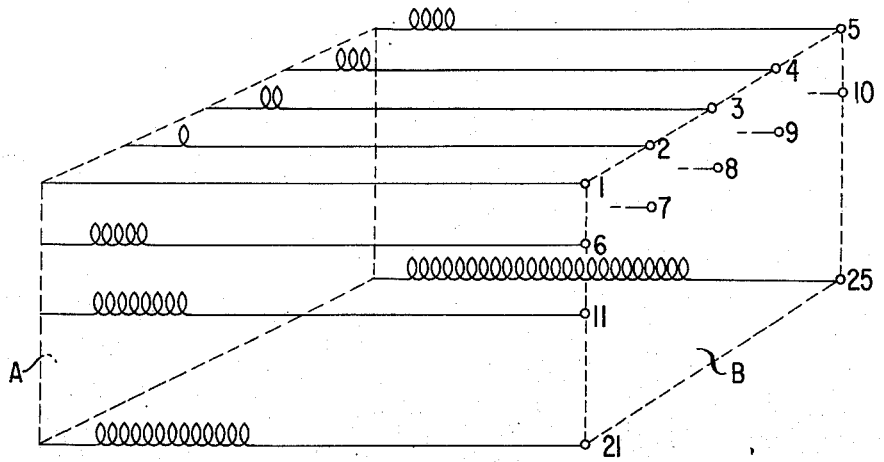
FIG. 2 schematically shows a two-dimensional organ array of fibers for producing raster scanning.

For simplicity the foregoing embodiment of FIG. 1 was described in terms of a line scanner. However, it is readily possible to extend its function to that of a raster scanner by utilizing a two-dimensional array of optical fibers as depicted in FIG. 2. For the purposes of illustration, FIG. 2 shows a 5 × 5 square array of 25 optical fibers in which the first fiber is the shortest and the $25^{th}$ is the longest. As before, the fibers are cut so that the difference in length $\delta$ between functionally adjacent fibers is uniform. Fibers are shown schematically as straight lines with loops intermediate the ends. Longer fibers have more loops than shorter fibers. This schematic representation is indicative of the fact that flexible optical fibers, often as thin as human hairs, could be wound on spools or other means in order to allow for longer fibers to have their ends terminated in the same input and output planes as shorter fibers. Thus, for example, the difference in length between fibers 1 and 2, 2 and 3, 3 and 4, and 4 and 5, which constitute the first row, is uniformly equal to $\delta$. Fibers 1 through 5 are not only physically adjacent, but also are functionally adjacent inasmuch as it is intended that an output pulse arrive at the end of fiber 1 first and that later pulses appear sequentially at the end of fibers 2, 3, 4 and 5. Note, however, that fiber 6 (the first fiber in the second row) is physically remote from but functionally adjacent to fiber 5 (the last fiber in the first row). Similarly, fibers 10 and 11 are functionally adjacent. Consequently, the difference in length between fibers 5 and 6, and between fibers 10 and 11, is also equal to $\delta$. With this arrangement light pulses scan the output plane B in raster fashion.

Memory Systems

In some types of optical memories information is written onto a surface (e.g., tape, disc, or drum) and is accessed along one or two dimensions by deflecting a laser beam. With prior art active deflection devices the scanning time is relatively slow; i.e., in the order of microseconds. Considerably faster scanning times of the order of nanoseconds should be achieved by utilizing the passive optical scanner of my invention. Illustrative examples of the use of my passive scanner in optical memories and in apparatus for video tape read-out and write-in are given below.

Figure 3:
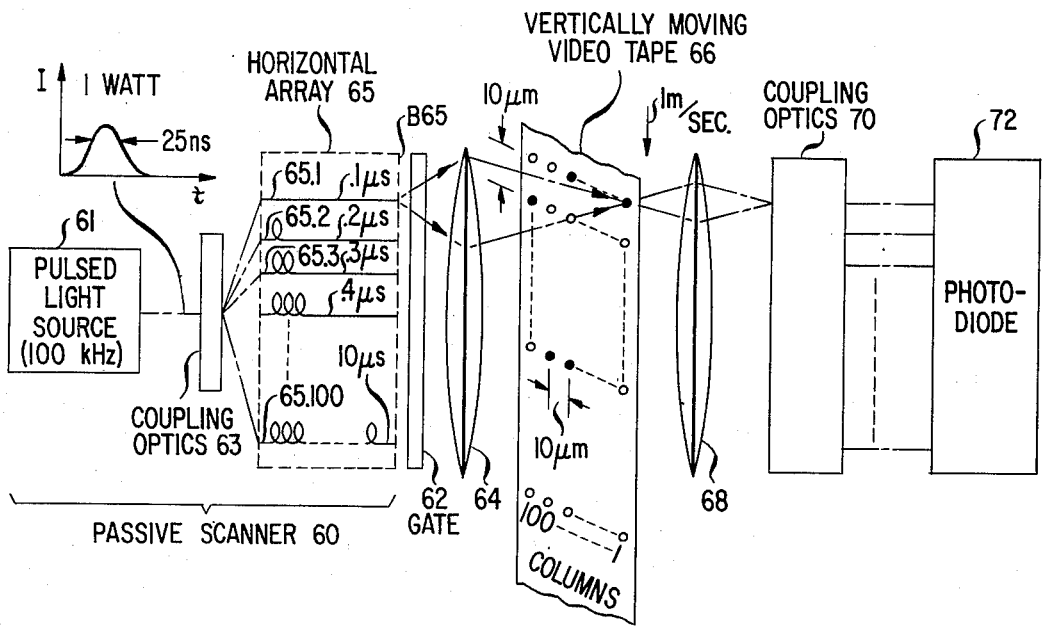
FIG. 3 schematically shows a memory system in accordance with one embodiment of my invention.

In a video tape read-out arrangement shown in FIG. 3, a video tape 66 carrying information in the form of 100 columns of dots of varying optical density (i.e., black, gray, transparent) on a transparent substrate (e.g., a film negative) moves vertically down at a modest speed of, say, 1 meter/sec in front of a photodiode 72. The dots are arranged vertically in columns which are 10 $\mu$m apart and horizontally in rows which are also 10 $\mu$m apart. Disposed between the video tape 66 and the photodiode 72 are in optional lens means 68 and coupling optics 70 which might include, for example, a bundle of optical fibers. The optional lens means 65 would be used to couple light into such fibers when included in optics 70.

On the side of the video tape 66 remote from the photodiode 72 is positioned a passive scanner 60 of the type described with reference to FIG. 1. As before, scanner 60 comprises a light source 61 which generates illustratively a 1 watt pulse of 25 ns duration every 10 $\mu$s. Coupling optics 63, which schematically designates the beam splitters 11 and lens means 12 of FIG. 1, is used to couple the pulses from source 61 into a horizontally oriented organ fiber array 65 comprising illustratively 100 fibers cut to uniformly different lengths to produce a uniform differential delay of 0.1 $\mu$s and total delays ranging from 0.1 $\mu$s to 10 $\mu$s.

In operation, every 10 $\mu$s laser 61 is pulsed for about 25 ns and the pulse generated is coupled into organ fiber array 65. The array 65 is arranged so that the first pulse to reach the output plane B65 originates from fiber 65.1 and strikes a dot in column No. 1 of tape 66. Then 0.1 $\mu$s later the second pulse to reach output plane B65 originates from fiber 65.2 (0.2 $\mu$s delay) and strikes a dot in column No. 2 and so on. In this regard, note that because of the combined effect of tape motion and inversion in the lens 64, the end of fiber 65.2 should be 0.1 $\mu$m higher than that of fiber 65.1, the end of fiber 65.3 should be 0.2 $\mu$m higher than that of fiber 65.1, and so on, to allow matching of each light pulse with the dot to be addressed.

Figure 4:
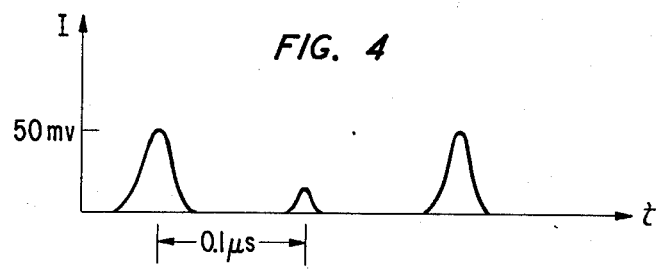
FIG. 4 is a graph showing a typical output of the photodiode of FIG. 3.

Effectively, therefore, a reading spot of light scans an entire row of dots on the tape 66 every 10 $\mu$s. The light transmitted through tape 66 is directed to a single photodiode 72, the output of which (shown illustratively in FIG. 4) is the video signal. Note that at the end of 10 $\mu$s a new row has moved into position so that the combined effect of the tape translation at 1 meter/sec and the pulses scanning at a rate of one row per 10 $\mu$s effectively multiplies the tape speed by a factor of one hundred; i.e., the ratio of the speed of the horizontally scanning light spot (10 $\mu$m/0.1 $\mu$s = 100 m/sec) to the speed of the vertically moving tape of 1m/sec is one hundred.

In a similar fashion, translating video tape 66 could be replaced by a rotating disc with the ends of the fibers of array 65 positioned along the grooves of the disc, thereby increasing the effective rotational speed of the disc. Therefore, the actual rotational speed required to achieve a particular read-out speed is reduced.

In order to perform video tape write-in, two modifications are made in the system of FIG. 3. First, the lens means 68, coupling optics 70, and the photodiode 72 can be omitted. Secondly, a gate 62, such as an electro-optic modulator, is positioned between the output plane B65 of array 65 and the video tape 66. An information source (not shown) is coupled to the gate 62 in order to transmit and/or block selected ones of the pulses generated by scanner 60. By means well known in the art, the information source is coordinated with the tape position so that light pulses from scanner 60 impinge upon only preselected information points; i.e., dots, in preselected rows and columns of tape 66.

In an application to computer memories, my passive scanner should attain greater speeds than that which can be achieved using state of the art components (e.g., the use of a plurality of magnetic reading heads positioned proximate a rotating drum). In this embodiment, an arrangement substantially identical to FIG. 3 is utilized with the following illustrative parameters: laser 61 generates pulses approximately 0.2 ns in duration, organ fiber array 65 comprises $10^4$ fibers cut to produce a uniform differential delay of 1 ns, and total delays ranging from 1 ns to 10 $\mu$s, and the tape 66 translates at a relatively higher speed of 100 meters/sec. With these parameters, therefore, a tape "page" can be defined as containing 1 megabit of information in 1 $cm^2$; that is, if the tape 66 is taken to be at least 10 centimeters wide, then a page can be defined as a rectangular zone 10 centimeters wide by 1 mm high which contains an array of dots of varying optical density spaced both horizontally apart and vertically apart by 10 $\mu$m so that $10^4$ columns fit in the 10 centimeter dimension.

In order to insure that the pulse dispersion in the longer fibers is less than 0.5 ns, use of graded index (Selfoc) fibers or single mode fibers in the entire array is perferred.

In this embodiment $10^4$ fibers are used to scan 1 spot per nanosecond; that is, $10^4$ spots in a row in 10 $\mu$s. The photodiode 72 consequently provides an electrical read-out at a rate of 1 gigabit per second. Because the tape (disc or drum) moves at 100 meters/sec, a spot or dot moves 1 mm in 10 $\mu$s, which is equivalent to 100 spot spacings (since the spots are 10 $\mu$m apart). Because there are 100 consecutive rows of dots in a page of data, as defined above, then one page passes the scanner every 10 $\mu$s. Which particular row will be read is determined by the firing time of the laser 61. The word of interest in the row of $10^4$ bits to be read out can be selected again by timing means well known in the art; i.e., by measuring the time elapsed after the firing of the laser.

Sampling Oscilloscope

Figure 5:
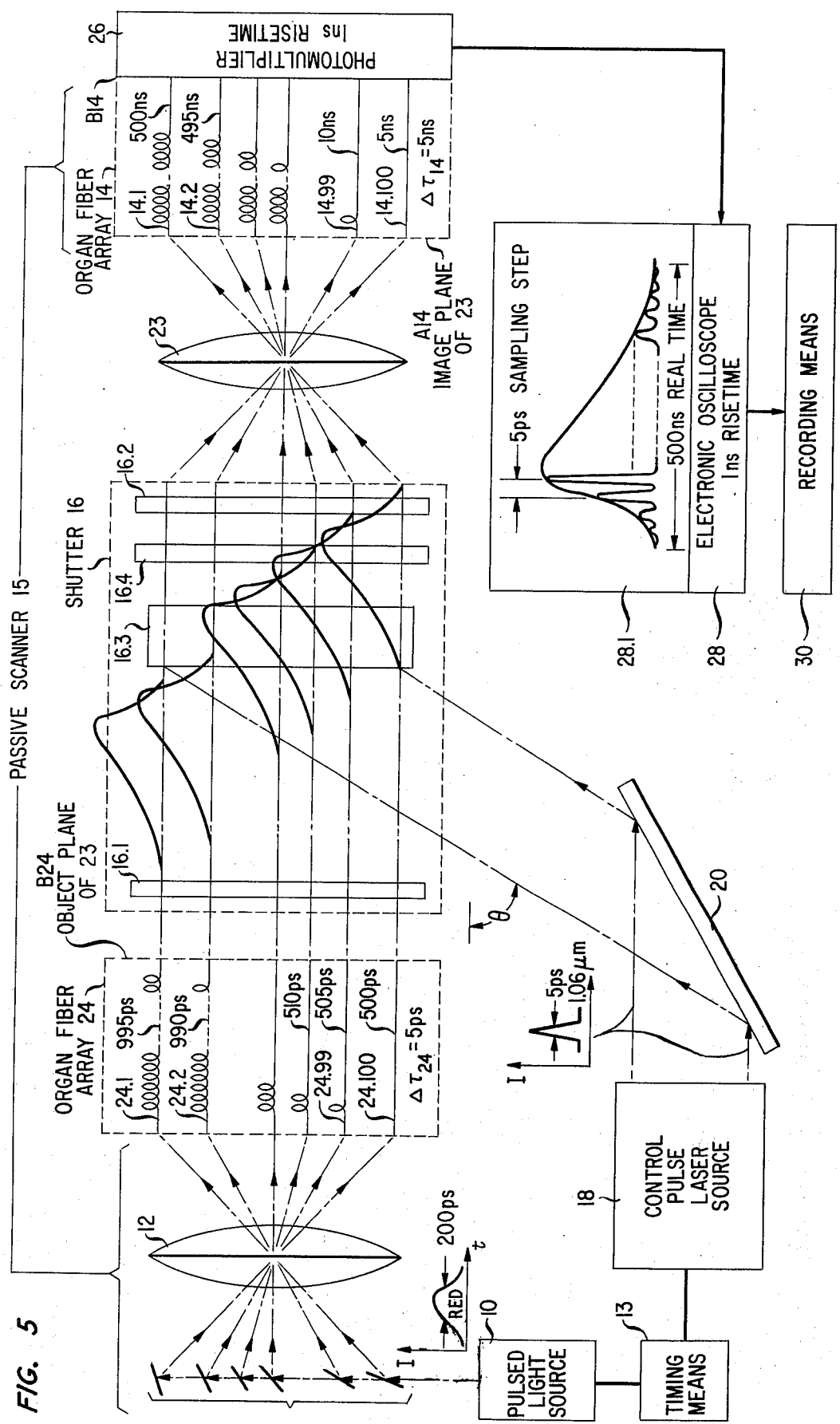
FIG. 5 schematically shows an optical sampling oscilloscope in accordance with another illustrative embodiment of my invention.

The passive scanner of FIG. 1 can also be utilized in an optical sampling oscilloscope illustratively depicted in FIG. 5. Consequently, components of FIG. 5 corresponding to those of FIG. 1 have been given identical reference numbers. The sampling oscilloscope comprises a passive scanner 15 and the tandem combination of a second organ fiber array 24, an optical gate or shutter 16 and lens means 23 interposed between lens means 12 and organ fiber array 14. Utilization means illustratively comprising a photomultiplier 26 converts the optical pulses at the output of array 14 to electrical signals which are coupled to an electronic oscilloscope 28 and optional recording means 30. In this arrangement the output plane B24 of the organ array 24 coincides approximately with the object plane of lens means 23, whereas the input plane A14 of organ array 14 coincides approximately with the image plane of lens means 23.

As described in my U.S. Pat. No. 3,671,747, the shutter 16 typically comprises a medium 16.3 in which birefringence can be optically induced by means of a high intensity, short duration, laser control pulse. This medium may be either a solid, such as glass, or a liquid, such as carbon disulphide. In either case, the medium 16.3 is disposed between a pair of crossed polarizers 16.1 and 16.2. Normally the gate is closed so that plane polarized pulses transmitted through polarizer 16.1 are absorbed by polarizer 16.2. In order to open the shutter 16, a control pulse from source 18 is directed at a shallow angle through the medium 16.3 to optically induce therein birefringence so that the polarization of pulses arriving from array 24 is changed sufficiently (i.e., preferably rotated by 90°) to permit transmission through polarizer 16.2. In particular, it has been found that the shallow angle $\theta$ between the direction of the control pulse and the direction of the pulses being sampled should be less than about 0.1 radians and preferably the two directions should be collinear. However, to achieve collinear propagation would require placing beam splitters or other suitable means within the shutter 16. As a practical matter, it is more convenient to reflect the control pulse off a suitable mirrow 20 oriented to direct the control pulse onto the medium 16.3 at the desired shallow angle. In order to prevent transmission of the control pulse into the other components of the system, a rejection filter 16.4 is positioned between medium 16.3 and polarizer 16.2. For example, where the pulse being sampled is red light (e.g., wavelength of 0.63 $\mu$m) and the control pulse is infrared (e.g., the 1.06 $\mu$m output of an Nd:YAG laser), then a suitable filter is No. KG3 manufactured by Schott Glassverk, West Germany.

The light pulse to be sampled and displayed is generated by source 10, and as before is directed through a plurality of beam splitters 11. Lens means 12 focuses the plurality of pulse generated by beam splitters 11 onto the input ends of the fibers of array 24 at input plane A24 which is positioned at the focal point of lens means 12. In order to synchronize the arrival of the source pulse and the control pulse at the medium 16.3 of shutter 16, there is provided timing means 13 which couples together source 10 and control source 18.

In order to obtain picosecond resolution, both the differential delay of the fibers of array 24 as well as the duration of the control pulse is typically a few picoseconds. However, in order that a commercially available real-time electronic oscilloscope 28, typically having a one nanosecond risetime, can display the sampled pulses, the differential delay of the fibers of array 14 is typically a few nanoseconds. In addition, the array 14 is arranged to introduce complementary delay: that is, a pulse experiencing the longest picosecond delay in array 24 is coupled to the shortest fiber in array 14 so that in the latter array it experiences the shortest nanosecond delay and conversely.

In general, the differential delays $\Delta \tau_{14}$ and $\Delta \tau_{24}$ of organ arrays 14 and 24, respectively, are chosen to satisfy the following inequalities:

$$\Delta \tau_{24} < < T \tag{1}$$

$$\Delta \tau_{14} < \tau_S \tag{2}$$

$$\Delta \tau_{14} < \tau_R \tag{3}$$

where T is the duration of the pulse to be sampled as measured at half maximum intensity, $\tau_S$ is the sampling time (i.e., the time for which shutter 16 is open) and $\tau_R$ is the risetime of photomultiplier 26 and/or electronic oscilloscope 28. Inequality (1) means that the plurality of pulses arriving at shutter 16 (i.e., at medium 16.4) spatially overlap on separate channels. Inequality (2) means that in reconstructing the short duration (e.g., 200 ps) sampled pulse on a longer time scale (e.g., 500 ns), the samples are each delayed by an amount greater than their duration (which corresponds to the sampling time plus any broadening due to dispersion in the fibers). And, inequality (3) means that the reconstructed samples arrive at photomultiplier 26 and/or oscilloscope 28 at a rate longer than the risetime (i.e., within the bandwidth) limitations of such apparatus.

Figure 6:
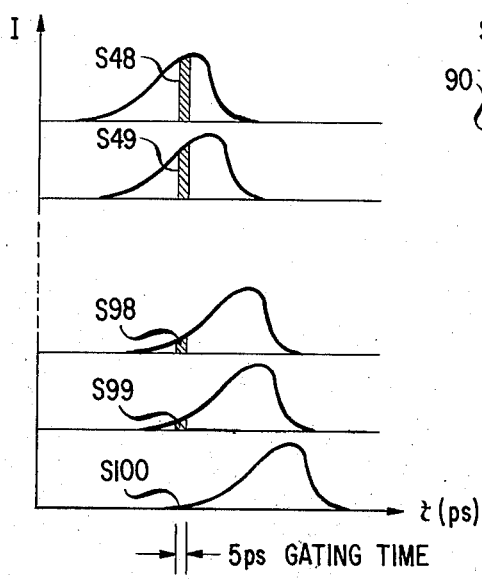
FIG. 6 is a graph depicting the manner in which the optical gate 16 of FIG. 5 samples the pulses delayed by organ fiber array 14 of FIG. 5.

The operation of my sampling oscilloscope can be readily understood from the following description in which numerical parameters are provided for the purposes of illustration only and are not to be construed as limitations upon the scope of the invention. Consider, therefore, that it is desired to display a red optical pulse having a wavelength at about 0.63 $\mu$m and a duration of approximately 200 ps as measured at half-maximum intensity. This pulse is divided into a plurality of 100 pulses of substantially identical transverse shape, but of lower peak power, by means of 100 beam splitters 11. These pulses propagate along separate optical paths and are focused by means of lens means 12 onto separate ones of the fibers of organ array 24. Organ array 24 comprises 100 low dispersion fibers cut to different lengths to provide delays in decrements of 5 ps. For example, fibers 24.1, 24.2, ... 24.100 provide, respectively, delays of 995 ps, 990 ps. . . . 500 ps. The output of organ array 24 at any particular instant of time constitutes a plurality of pulses on separate parallel paths (channels), with the differential delay between pulses in adjacent channels 5 ps. These pulses are passed through an optical shutter 16 utilizing a 1 cm long carbon disulphide medium 16.3. The framing (i.e., sampling) time of the optical shutter is determined primarily by the duration of the 1.06 $\mu$m control pulse which is typically 5 ps. At any particular instant of time, therefore, the plurality of delayed pulses appearing at medium 16.3 are distributed in space as illustratively depicted in FIG. 6. Therefore, when the gate is opened for approximately 5 ps by the control pulse, a plurality of time coincident samples of 5 ps duration and of varying heights is transmitted through polarizer 16.2. These samples are designated in FIG. 6 as S100, S99, S98 . . . corresponding to the samples derived from fibers 24.100, 24.99, 24.98 . . . , respectively. Thus, light pulses on the various channels are sampled at different sampling times for each channel but all 100 channels are sampled at the same real time.

These time coincident samples are now inversely delayed in order to reconstruct the original shape of the 200 ps pulse to be displayed. To this end the time coincident samples are coupled through lens means 23 to the input plane A14 of organ array 14. In the latter array 100 fibers 14.1, 14.2 . . . 14.100 are cut to provide delays in decrements of 5 ns. Thus, fibers 14.1, 14.2 . . . 14.00 have respectively delays of 500 ns, 495 ns . . . 5 ns. The coupling optics are such that only light from the $m^{th}$ fiber in organ array 24 is coupled into the $n^{th}$ fiber of the organ array 14. Thus, for example, light from fiber 24.1, which experienced a 995 ps delay, is coupled into fiber 14.100 where it experiences only a 5 ns delay. In contrast, light from fibers 24.100 which experienced a 500 ps delay is coupled into fiber 14.1 where it experiences a 500 ns delay. Each fiber in organ array 14 receives substantially simultaneously (noting the different path lengths through lens means 23) a 5 ps sample of red light and the $n^{th}$ fiber 14.n gives rise ($n \times 5$) ns later to an electrical pulse about 2 ns at half-height characteristic of the response time of photomultiplier 26. Note that the fibers of organ array 14 also have low dispersion, i.e., a 5 ps red sample typically broadens to less than 1 ns on the longest fiber 14.1.

The function of the organ array 14 is to introduce a complementary delay (as compared to that introduced by array 24) and to place the samples in a nanosecond time domain compatible with the bandwidth of electronic oscilloscope 28 (e.g., a Tektronix 7904). Thus, the light coupled through organ array 14 is detected by a photomultiplier 26 of 1 ns risetime and is displayed on an equally fast oscilloscope 28 which is set, for example, at a time sweep of 500 ns full scale. The envelope of the 100 pulses which appear on the screen 28.1 of oscilloscope 28 represents the light signal that was incident on the organ array 24 in the time interval 500 to 1000 ps prior to the opening of the shutter 16. Optional recording means 30 may include, for example, a camera or memory device for making a permanent record of the sampled pulse.

Image Converter

There are instances where images recorded on film are formed in a time span of a few nanoseconds. This occurs, for example, in the photography of ultrashort light pulses in flight (U.S. Pat. No. 3,669,541), in photographing indoor scenes illuminated by nanosecond light pulses, and more generally, in ultrahigh speed photography where cameras are equipped with electro-optic shutters of nanosecond speed, An organ fiber array can be used, in place of photographic film, to transform the two-dimensional information present in an image, into a sequence of analog electrical pulses for transmission over telephone lines or for storage in computer memories.

Figure 7:
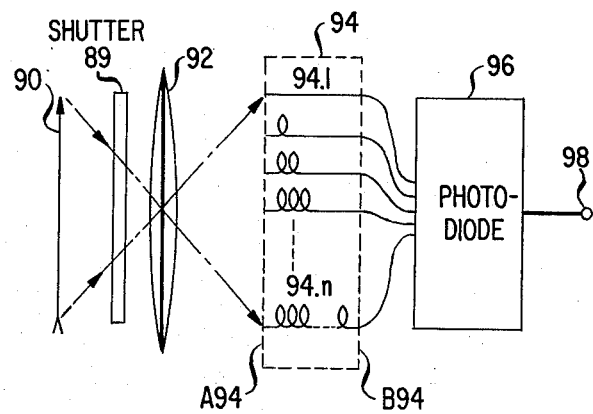
FIG. 7 schematically shows an image converter in accordance with still another embodiment of my invention.

In an illustrative embodiment of an image converter shown in FIG. 7, an optical image 90 to be converted into an electrical analog is coupled through a nanosecond shutter 89 (e.g., an electro-optic shutter), and lens means 92 to the input plane A94 of an organ fiber array 94 adapted to produce a uniform differential delay $\Delta\tau_{94}$. In essence, the image "self-scans" in that different spatial portions (i.e., samples) of the image are coupled into separate fibers of array 94. These samples are differentially delayed in array 94 and are then coupled to a suitable detector such as photodiode 96. The output of photodiode 96 is a single bus 98 on which appears in time sequence a plurality of samples spaced from one another by $\Delta\tau_{94}$ which is made to be greater than the risetime of photodiode 96. Of course, the samples vary in intensity according to the spatial intensity distribution of the image 90.

A special case of the foregoing is the x-y coordinate locater described below.

The x-y Coordinate Locater

Figure 8:
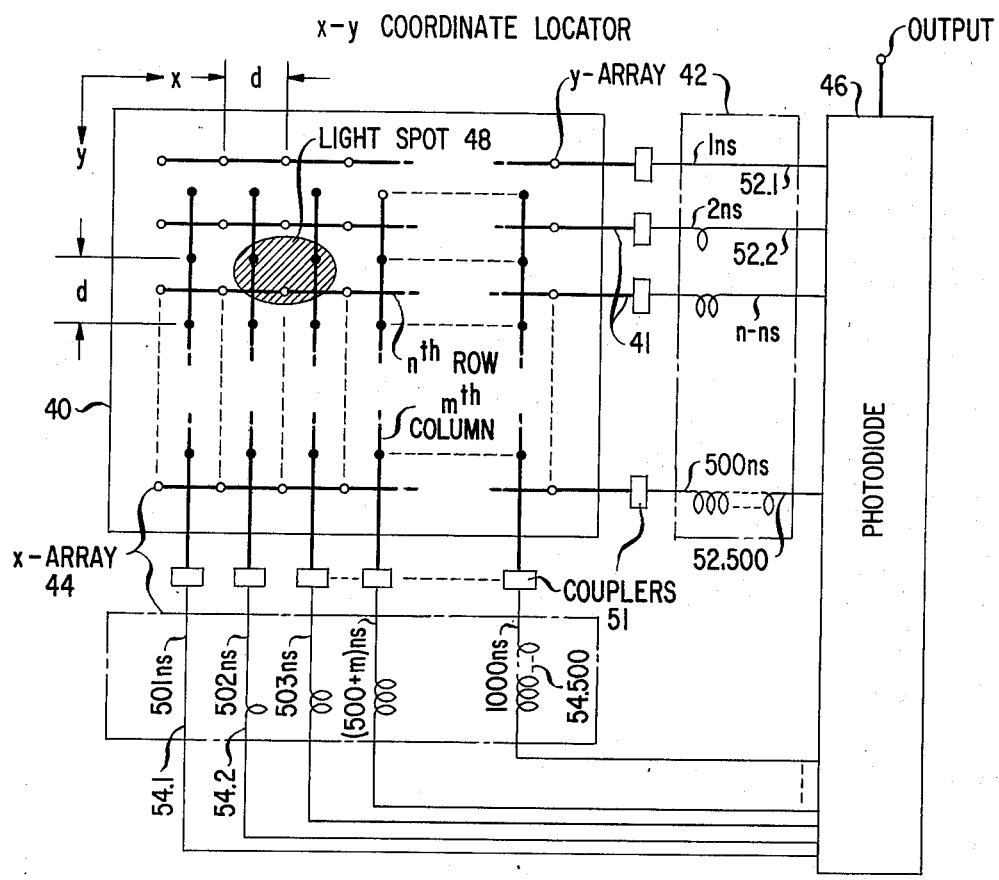
FIG. 8 schematically shows an x-y coordinate locater in accordance with yet another embodiment of my invention.
Figure 9:
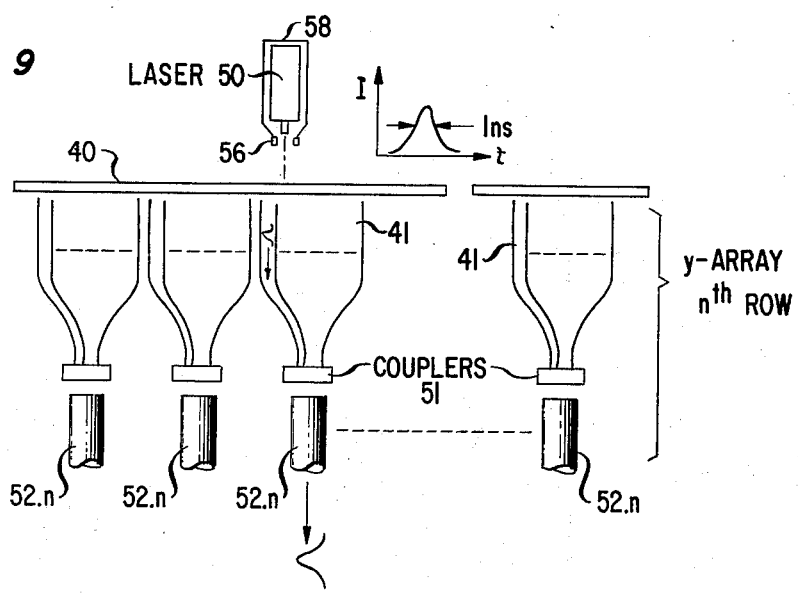
FIG. 9 is a schematic side view showing a preferred arrangement of the fibers under the writing surface of FIG. 8.

This embodiment of my invention utilizes the ability of an organ fiber array, when excited by a pulsed laser, to code one dimension into a time interval. Two such arrays, therefore, can be used to code the position of a light pulse in two dimensions as illustrated in the following example of an x-y coordinate locater. As shown in FIGS. 8 and 9, an illustrative locater comprises a thin writing surface 40 transparent to light pulses produced by a laser 50 which is translatable in space to perform a writing function. On the side of the writing surface 40 remote from the laser 50 are positioned two distinct arrays of fibers. One fiber array 42, the ends of which are depicted as white circles in FIG. 8, is used to locate the vertical position (y-axis) of the pen; the second fiber array 44, the ends of which are depicted as black circles in FIG. 8, is used to locate the horizontal position (x-axis) of the pen. One set of ends of each array is terminated in a plane parallel to surface 40. Additionally, as shown in FIG. 9, each fiber of the y-array 42 comprises a relatively short fiber 41, typically about 5 cm long (about 0.25 ns delay), the ends of which correspond to the white circles of FIG. 8. Groups of the short fibers 41 are coupled in fan-in fashion through couplers 51 to relatively longer and larger diameter 52 which are cut to produce prescribed delays. Similarly, in the x-array 44 the short fibers 41 are coupled in fan-in fashion to longer fibers 54 also cut to produce prescribed delays, which however are mutually exclusive from the set of delays produced by fibers 52 of the y-array.

Consider, for example, that the y-array 42 and x-array 44 each comprise an array of 500 × 500 short fibers 41 and that each row of the y-array and each column of the x-array are fanned-in to ten longer and larger diameter fibers of the type 52 and 54. That is, in the y-array 42 any one of the 500 short fibers 41 in the $n^{th}$ row is coupled to one of 10 longer fibers 52.n each of which produces an n-nanosecond delay ($1 \leq n \leq 500$) to photodiode 46. Thus, in y-array 42 the 10 fibers 52.1 of the first row each produce a delay of 1 ns, the 10 fibers 52.2 of the second row each produce a delay of 2 ns and in general, the 10 fibers 52.n of the $n^{th}$ row produce an $n$-nanosecond delay. Similarly, in the x-array any one of the 500 short fibers 41 in the $m^{th}$-column is coupled to one of 10 longer fibers 54.m each of which produces a (500+m) nanosecond delay ($1 \leq m \leq 500$) to photodiode 45. Thus, in x-array 44 the 10 fibers 54.1 of the first column each produce a delay of 501 ns, the 10 fibers 54.2 of the second column each produce a delay of 502 ns and in general, the 10 fibers 54.m of the $m^{th}$-column produce a ($500 + m$) nanosecond delay.

Thus, it is apparent that the y-array 42 has a set of delays from 1 to 500 ns which is mutually exclusive from the set of delays from 501 to 1000 ns of the x-array 44. In addition, as shown in FIG. 8, the ends of the fibers of the two arrays are interleaved so that a light spot 48 from laser 50 always overlaps at least two fiber ends, one of which is in the x-array and one of which is in the y-array.

Figure 10:
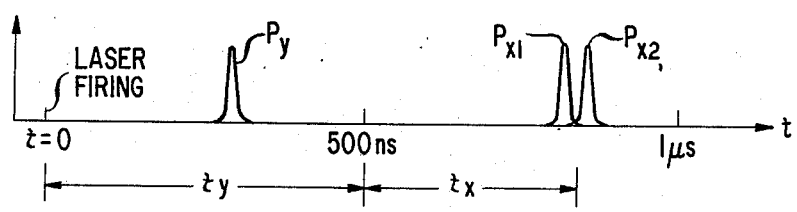
FIG. 10 is a graph showing a typical electrical output from the photodiode of FIG. 8.

As shown in FIG. 9, a light pen including a laser 50, which typically emits a 1 ns pulse every millisecond, is used to write on the writing surface 40. The pen may also carry on the end of housing 58 a felt 56 which is capable of writing on the surface 40 with an ink transparent to the light emitted by the laser 50. The light spot 48 on the writing surface 40 is made to be large enough to cover at least two adjacent fibers, one fiber from each array. As shown in FIG. 10, when the light pen emits a light spot or pulse at time $t = 0$, at least two light pulses propagate to the photodiode 46. The arrival time $t_y$ of the first pulse $P_y$ in the first 500 ns interval is proportional to the y-coordinate. The arrival time of the second pulse $P_x$ in the 500 to 1000 ns interval is proportional to the x-coordinate. If the laser sport 48 is large enough, it is possible as shown in FIG. 8 for the spot to cover two fiber ends in the same row (or column). In such a case, two pulses Px1 and $P_{x2}$ would be received by photodiode 46 in the interval 500 to 1000 ns. The x-coordinate would then be proportional to the average time of arrival of the two pulses. These arrival times can be electronically coded into binary bits for transmission over telephone lines or the like by means well known in the art.

It is to be understood that the above described arrangements are merely illustrative of the many possible specific embodiments which can be devised to represent application of the principles of our invention. Numerous and varied other arrangements can be devised in accordance with these principles by those skilled in the art without departing from the spirit and scope of the invention. In particular, where an x-y coordinate locater with lower resolution (i.e., fewer fibers) is desired, then it would be possible to utilize a single organ array with each fiber having a different length corresponding to a separate point in the x-y plane, and still be able to maintain the differential delay within the capabilities of state-of-art electronics and the optical losses of the longer fibers within tolerable limits.

What is claimed is:
1. An optical memory system comprising:
   1. a passive optical scanner comprising
      a. means for producing from a light pulse of duration T a plurality of light pulses propagating along spatially separate paths, each of said plurality being substantially identical in transverse shape to the light pulse from which it is produced,
      b. a first array of optical fibers of different lengths with the difference in length between functionally adjacent fibers being uniform, each of said fibers being arranged so that one end thereof terminates in an input plane and the opposite end thereof terminates in an output plane, said difference in length producing a substantially uniform difference in time delay $\Delta\tau_1$ between functionally adjacent fibers so that $\Delta\tau_1 > T$, and
      c. means for coupling each of said plurality of light pulses into separate ones of said fibers at said input plane so that said plurality of light pulses arrive at said output plane at different times and in different spatial locations, thereby to scan said output plane,
   2. a movable information storage member positioned to receive optical pulses emanating from the output plane of said scanner,
   3. means for focusing pulses emanating from said scanner onto predetermined locations of said member, and
   4. detection means for detecting pulses which impinge upon said member.

2. The system of claim 1 for reading out information wherein
   said member comprises an elongated transparent tape containing information at said locations in the form of variations of optical density of said tape,
   said tape is translatable in a first direction at a speed v in m/sec, and
   the fibers of said array of said scanner are arranged in a line nearly orthogonal to said first direction and are offset from orthogonality relative to adjacent fibers by a distance $d = v\Delta\tau$, where $\Delta\tau$ is the uniform difference in time delay between functionally adjacent fibers of said array.

3. An optical memory system comprising
   1. a passive optical scanner comprising
      a. means for producing from a light pulse of duration T a plurality of light pulses propagating along spatially separate paths, each of said plurality being substantially identical in transverse shape to the light pulse from which it is produced,
      b. a first array of optical fibers of different lengths with the difference in length between functionally adjacent fibers being uniform, each of said fibers being arranged so that one end thereof terminates in an input plane and the opposite end thereof terminates in an output plane, said difference in length producing a substantially uniform difference in time delay $\Delta \tau_1$ between functionally adjacent fibers so that $\Delta \tau_1 > T$, and c. means for coupling each of said plurality of light pulses into separate ones of said fibers at said input plane so that said plurality of light pulses arrive at said output plane at different times and in different spatial locations, thereby to scan said output plane, 2. a movable information storage member positioned to receive optical pulses emanating from the output plane of said scanner,
3. means for focusing the pulses emanating from said scanner onto predetermined locations of said member, and
4. an optical modulator positioned between said scanner and said member for transmitting to said member only predetermined ones of said pulses in accordance with information to be written into said member.

* * * * *